(12) United States Patent
Brandt

(10) Patent No.: US 11,543,970 B2
(45) Date of Patent: Jan. 3, 2023

(54) MANAGING DYNAMIC TEMPERATURE THROTTLING THRESHOLDS IN A MEMORY SUBSYSTEM

(71) Applicant: Micron Technology, Inc., Boise, ID (US)

(72) Inventor: Kevin R. Brandt, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 252 days.

(21) Appl. No.: 16/744,111

(22) Filed: Jan. 15, 2020

(65) Prior Publication Data

US 2021/0216216 A1    Jul. 15, 2021

(51) Int. Cl.
| | | |
|---|---|---|
| *G11C 7/04* | (2006.01) | |
| *G06F 3/06* | (2006.01) | |
| *G06F 1/20* | (2006.01) | |
| *G06F 11/10* | (2006.01) | |

(52) U.S. Cl.
CPC ............ *G06F 3/0613* (2013.01); *G06F 1/206* (2013.01); *G06F 3/0653* (2013.01); *G06F 3/0659* (2013.01); *G06F 3/0673* (2013.01); *G06F 11/1068* (2013.01)

(58) Field of Classification Search
CPC ...... G06F 3/0613; G06F 1/206; G06F 3/0653; G06F 3/0659; G06F 3/0673; G06F 11/1068; G06F 1/3275; G06F 11/1048; G06F 12/00; G11C 7/04; Y02D 10/00
USPC .......................................................... 714/764
See application file for complete search history.

(56) References Cited

U.S. PATENT DOCUMENTS

| | | | |
|---|---|---|---|
| 6,710,663 B1 * | 3/2004 | Berquist | ................. H03L 1/026 |
| | | | 331/3 |
| 7,233,538 B1 | 6/2007 | Wu et al. | |
| 9,520,200 B2 | 12/2016 | Mylly et al. | |
| 9,760,311 B1 * | 9/2017 | Amir | ..................... G06F 3/0616 |
| 9,761,290 B1 * | 9/2017 | Kankani | ................. H01L 23/36 |
| 2003/0230939 A1 * | 12/2003 | Hu | .......................... G06F 1/206 |
| | | | 307/117 |

(Continued)

FOREIGN PATENT DOCUMENTS

WO    2019/173534 A1    9/2019

OTHER PUBLICATIONS

International Search Report and Written Opinion, PCT App. No. PCT/US2021/012535, dated Apr. 26, 2021, 09 pages.

*Primary Examiner* — Albert Decady
*Assistant Examiner* — Enam Ahmed
(74) *Attorney, Agent, or Firm* — Nicholson De Vos Webster & Elliott LLP

(57) ABSTRACT

Exemplary methods, apparatuses, and systems include a media temperature manager receiving operating temperature measurements for a memory subsystem. The media temperature manager generates an average temperature using the operating temperature measurements. The media temperature manager determines that the average temperature satisfies a first value for a dynamic temperature threshold. The dynamic temperature threshold indicates a temperature at which the memory subsystem throttles media operations. The media temperature manager increases the dynamic temperature threshold to a second value in response to the average temperature satisfying the first value for the dynamic temperature threshold.

16 Claims, 5 Drawing Sheets

(56) References Cited

U.S. PATENT DOCUMENTS

| | | | |
|---|---|---|---|
| 2006/0146629 A1* | 7/2006 | Lee | G11C 7/04 |
| | | | 365/222 |
| 2014/0351621 A1* | 11/2014 | Conroy | G06F 1/324 |
| | | | 713/340 |
| 2015/0134988 A1* | 5/2015 | Wang | G06F 1/324 |
| | | | 713/320 |
| 2015/0254136 A1* | 9/2015 | Hoya | G06F 11/1012 |
| | | | 714/764 |
| 2016/0034349 A1* | 2/2016 | Choi | G11C 29/26 |
| | | | 714/764 |
| 2016/0320995 A1* | 11/2016 | Warriner | G06F 1/206 |
| 2016/0378149 A1* | 12/2016 | Kam | G06F 1/3206 |
| | | | 713/320 |
| 2017/0235633 A1* | 8/2017 | Park | G06F 11/1048 |
| | | | 714/764 |
| 2017/0249091 A1* | 8/2017 | Hodes | G06F 1/3296 |
| 2018/0046231 A1* | 2/2018 | Raghu | G06F 3/0653 |
| 2019/0371402 A1* | 12/2019 | Lin | G11C 5/063 |

\* cited by examiner

MANAGING DYNAMIC TEMPERATURE THROTTLING THRESHOLDS IN A MEMORY SUBSYSTEM

TECHNICAL FIELD

The present disclosure generally relates to temperature throttling thresholds in a memory subsystem, and more specifically, relates to managing one or more dynamic temperature throttling threshold values based upon an average operating temperature of the memory subsystem or a portion thereof.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
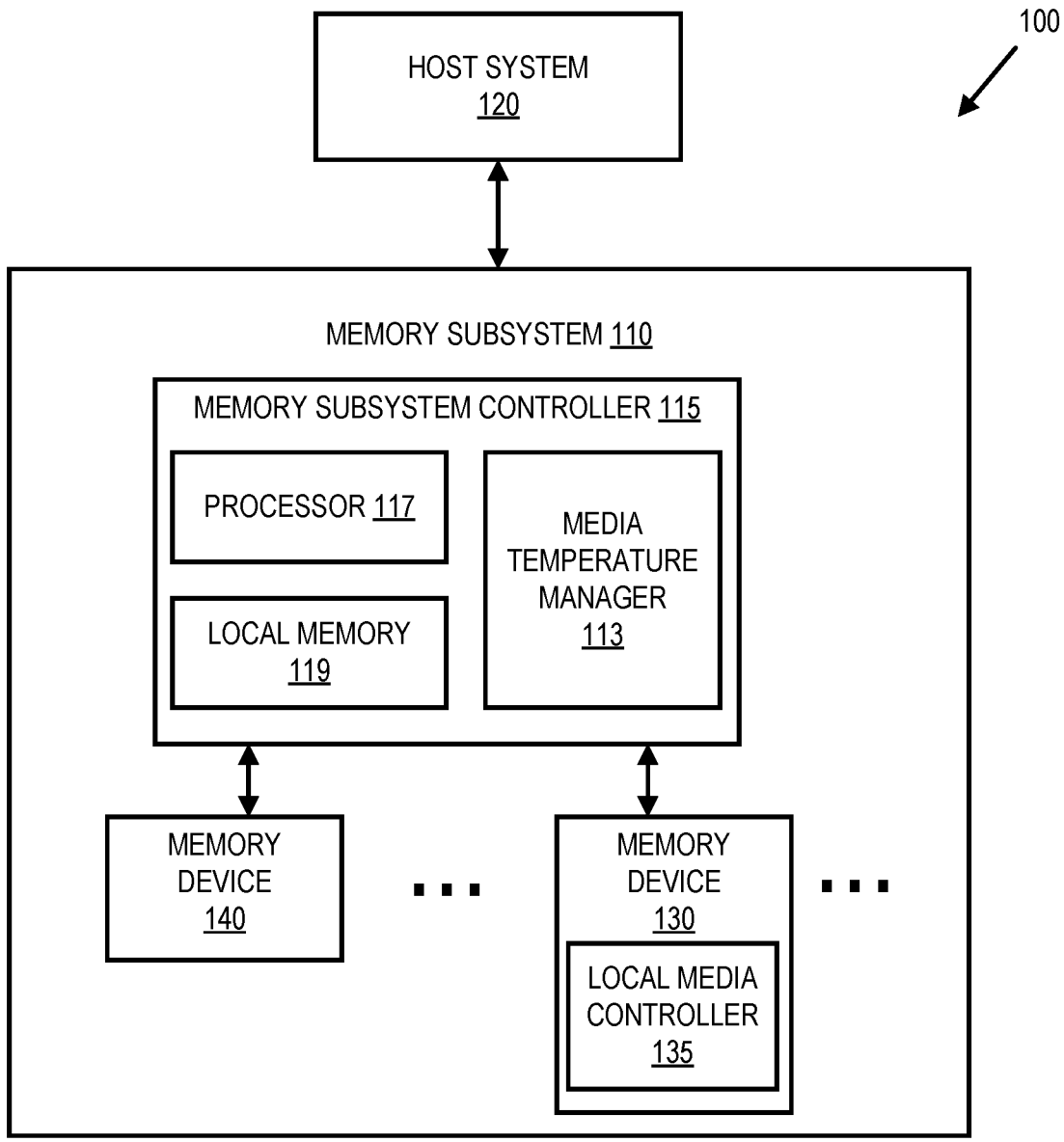
FIG. 1 illustrates an example computing environment that includes a memory subsystem in accordance with some embodiments of the present disclosure.

Aspects of the present disclosure are directed to managing one or more dynamic temperature throttling threshold values in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The memory devices can include, for example, non-volatile memory devices (e.g., NAND). Other types of memory devices, including volatile memory devices, are described in greater detail below in conjunction with FIG. 1. The host system can provide data to be stored at the memory subsystem and can request data to be retrieved from the memory subsystem.

Data integrity within memory subsystems varies with operating temperature. For example, high operating temperatures can lead to data loss and decreased endurance of the memory subsystem. Additionally, data written at a first temperature and read at a second temperature can be error-prone when the cross-temperature difference (between the first and second temperatures) is too great. Accordingly, conventional memory subsystems employ one or more temperature thresholds to throttle operations and, in turn, decrease the operating temperature and/or protect data integrity. A first temperature threshold can trigger reduced memory operation speed/throughput while a second temperature threshold triggers a halt of all memory operations or a shutdown of the memory subsystem. If a temperature threshold is set too low, however, the memory subsystem performance suffers, e.g., in terms of throughput. If the temperature threshold is set too high, the memory system is prone to data loss and poor performance due to errors/loss of data integrity. Given that memory subsystems are subjected to various operating temperatures, memory subsystems are often designed with a static temperature threshold based upon a worst-case scenario. Such a worst-case scenario often sacrifices throughput for endurance and data integrity.

Aspects of the present disclosure address the above and other deficiencies by managing one or more dynamic temperature thresholds. Embodiments track a history of operating temperature measurements to generate an average operating temperature. When the average temperature satisfies a dynamic temperature threshold, embodiments increase the dynamic temperature threshold. Likewise, when the average temperature does not satisfy the dynamic temperature threshold, embodiments decrease the dynamic temperature threshold. As a result, embodiments allow for greater throughput when the average operating temperature is low relative to a range of dynamic temperature thresholds and secure memory subsystem endurance and data integrity when the average operating temperature is high relative to the range of dynamic temperature thresholds.

Additionally, aspects of the present disclosure manage dynamic error correction scheme prioritization. For example, a memory subsystem can employ multiple error correction schemes, each applied in an order according to priority until successfully correcting the errors in data read from the memory subsystem media. Using the temperature measurements, embodiments can track operating temperature outliers. When the temperature measurements satisfy a distribution threshold (e.g., the measurements do not include too many outliers), an error correction scheme for cross-temperature errors can be given a lesser priority than one or more other error correction schemes. Similarly, when the temperature measurements do not satisfy the distribution threshold (e.g., the measurements include too many outliers), the error correction scheme for cross-temperature errors can be given a greater priority than one or more other error correction schemes. As a result of the dynamic prioritization of error correction schemes, embodiments can employ error correction schemes in an order that is likely to reduce the number of error correction schemes applied during error correction and produce corrected results quickly.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single-level cells (SLC) can store one bit per cell. Other types of memory cells, such as multi-level cells (MLCs), triple-level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem).

In general, the memory subsystem controller 115 can receive commands or operations from the host system 120 (e.g., read and write commands) and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a media temperature manager 113 that can manage dynamic temperature thresholds for throttling media operations. In some embodiments, the media temperature manager 113 manages a dynamic error correction scheme prioritization. In some embodiments, the controller 115 includes at least a portion of the media temperature manager 113. For example, the controller 115 can include a processor 117 configured to execute instructions stored in local memory 119 for performing the operations described herein. In some embodiments, the media temperature manager 113 is part of the host system 120, an application, or an operating system.

The media temperature manager 113 can track a history of operating temperature measurements of the memory devices 130 to generate a moving average operating temperature. When the average operating temperature satisfies a dynamic temperature threshold, embodiments can increase the dynamic temperature threshold. Likewise, when the average temperature does not satisfy the dynamic temperature threshold, embodiments can decrease the dynamic temperature threshold. Additionally, the memory subsystem 110 can employ multiple error correction schemes, each applied in an order according to priority. Using the temperature measurements, embodiments can track the operating temperature distribution. When the temperature measurements satisfy a distribution threshold, the media temperature manager 113 can give an error correction scheme for cross-temperature errors a lesser priority than one or more other schemes. Similarly, when the temperature measurements do not satisfy the distribution threshold, the media temperature manager 113 can give the error correction scheme for cross-temperature errors a greater priority than one or more other error correction schemes. Further details with regards to the operations of the media temperature manager 113 are described below.

Figure 2:
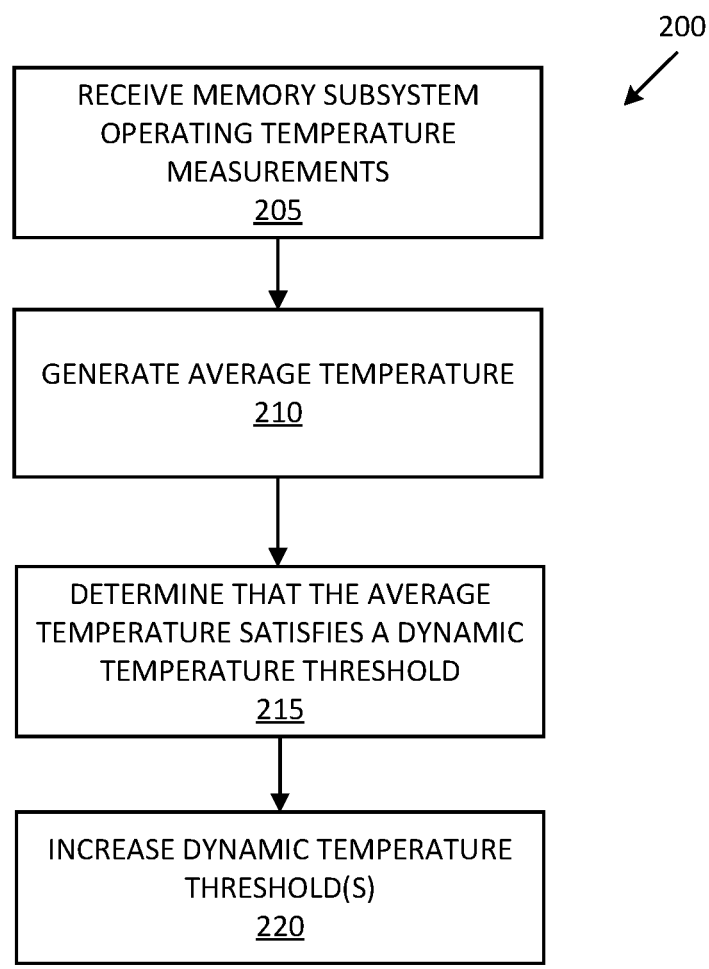
FIG. 2 is a flow diagram of an example method to manage one or more dynamic temperature throttling thresholds in accordance with some embodiments of the present disclosure.

FIG. 2 is a flow diagram of an example method 200 to manage one or more dynamic temperature throttling thresholds in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the media temperature manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing device receives operating temperature measurements for the memory devices 130. For example, the memory subsystem 110 can include a thermal sensor and the media temperature manager 113 periodically receives or otherwise reads an operating temperature measurement from the thermal sensor. In one embodiment, the media temperature manager 113 stores operating temperature measurements in the local memory 119. For example, the media temperature manager 113 can receive and store operating temperature measurements in a data structure and map or otherwise associate each operating temperature measurement with a time the measurement was taken and/or a portion of memory that was subject to an operation (e.g., a read or write) when the measurement was taken. In one embodiment, the media temperature manager 113 can only store a limited number of operating temperature measurements and, once the limit has been reached, the media temperature manager 113 removes the oldest measurement and adds the newest measurement.

At operation 210, the processing device generates an average temperature using multiple operating temperature measurements. For example, the media temperature manager 113 reads a set of stored operating temperature measurements from the local memory 119 and generates an average. In one embodiment, the media temperature manager 113 generates a running average. For example, the media temperature manager 113 calculates a simple running average of the most recent operating temperature measurements stored in the local memory 119. In another embodiment, the media temperature manager 113 generates a cumulative running average (e.g., using a previously generated average in addition to recent temperature measurements) or another representation of the operating temperature measurements. In one embodiment, the media temperature manager 113 stores the average temperature in the local memory 119.

At operation 215, the processing device determines that the average temperature satisfies a dynamic temperature threshold. For example, the media temperature manager 113 compares the average temperature to a dynamic temperature threshold value stored in the local memory 119. In one embodiment, the average temperature satisfies the dynamic temperature threshold when the average temperature is less than the dynamic temperature threshold value.

At operation 220, the processing device increases the dynamic temperature threshold value in response to determining that the average temperature satisfies the dynamic temperature threshold. For example, if the dynamic temperature threshold is currently assigned a value of 60 degrees Celsius and the average temperature is 30 degrees Celsius, the media temperature manager 113 updates the dynamic temperature threshold to a new value of 65 degrees Celsius. Other embodiments can increase the dynamic temperature threshold by a greater or a lesser amount.

In one embodiment, the dynamic temperature threshold is one of multiple thresholds. Example temperature thresholds can include one or more of: a first temperature threshold at or above which the memory subsystem 110 throttles or otherwise restricts the throughput of memory operations, a second temperature threshold at or above which the memory subsystem 110 halts all memory operations, a third temperature threshold at or below which the memory subsystem 110 returns from halting memory operations to throttled memory operation throughput, and a fourth temperature threshold at or below which the memory subsystem 110 returns from throttled or halted memory operation throughput to normal operation throughput. In some embodiments, the first and fourth temperature thresholds are set to the same value and/or a single temperature threshold is used for both purposes. In some embodiments, the second and third temperature thresholds are set to the same value and/or a single temperature threshold is used for both purposes.

In one embodiment, the processing device increases multiple temperature threshold values in response to determining that the average temperature satisfies the dynamic temperature threshold. For example, the media temperature manager 113 determines that the average temperature is less than a first dynamic temperature threshold value at or above which the memory subsystem 110 throttles or otherwise restricts the throughput of memory operations (the first temperature threshold) and, in response, increases one or more of the first, second, third, and fourth temperature threshold values described above.

Figure 3:
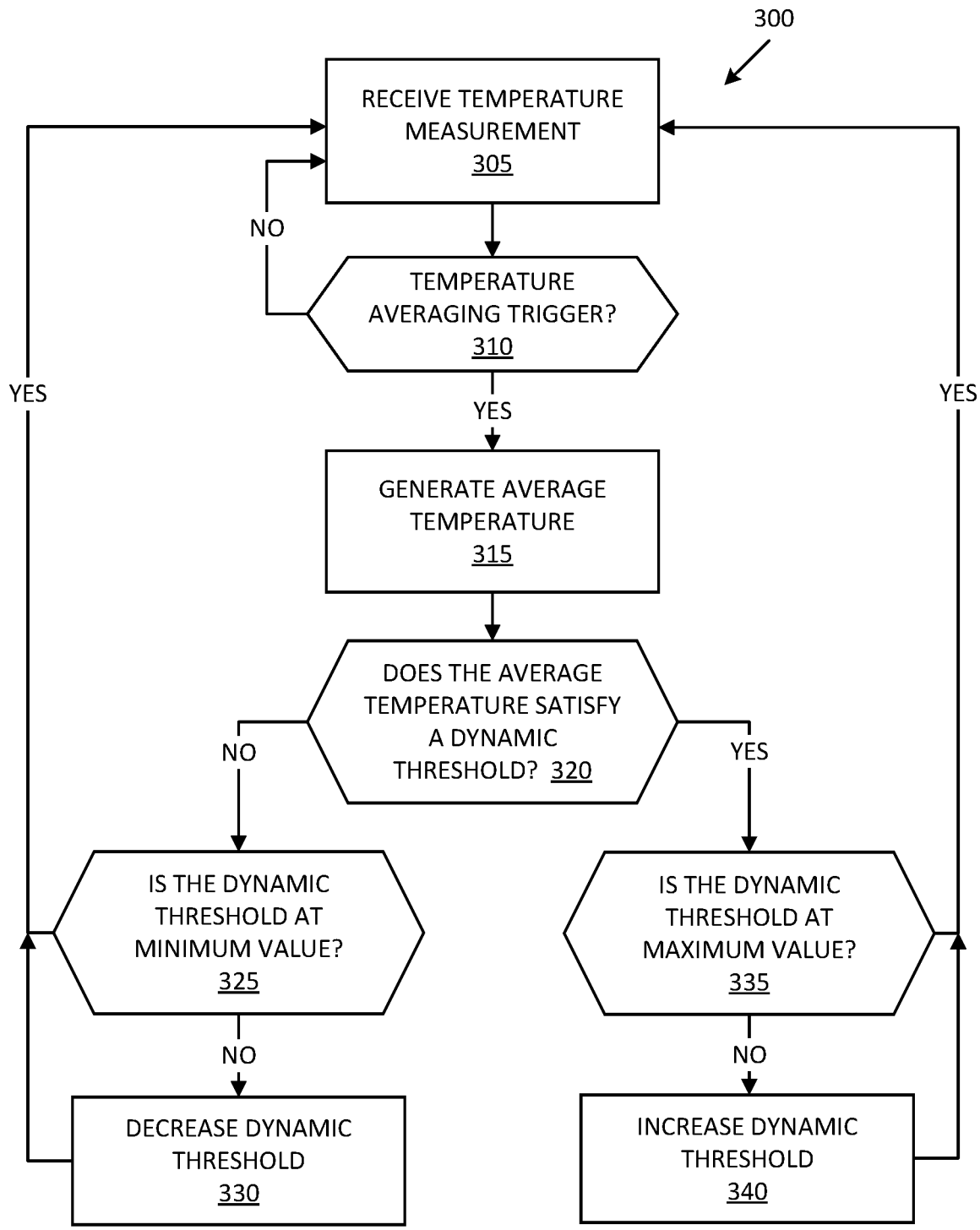
FIG. 3 is a flow diagram of another example method to manage one or more dynamic temperature throttling thresholds in accordance with some embodiments of the present disclosure.

FIG. 3 is a flow diagram of an example method 300 to manage one or more dynamic temperature throttling thresholds in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the media temperature manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device receives operating temperature measurements for the memory devices 130. As described above, the memory subsystem 110 can include a thermal sensor and the media temperature manager 113 periodically receives and stores an operating temperature measurement from the thermal sensor.

At operation 310, the processing device determines if a trigger event for generating an average temperature has occurred. The media temperature manager 113 can use an amount of time passing, the completion of a number of program-erase (PE) cycles (or average number of PE cycles), or another event to trigger the generation of an average temperature. Using five hundred PE cycles as an example trigger, the method 300 returns to operation 305 until a PE cycle count reaches five hundred or multiple thereof (e.g., a modulo operation using the PE cycle count and five hundred results in zero). Once the PE cycle count reaches five hundred or multiple thereof, the method 300 proceeds to operation 315.

At operation 315, the processing device generates an average temperature using multiple operating temperature measurements. As described in the examples above, the media temperature manager 113 can read a set of stored operating temperature measurements from the local memory 119 and generate a running average.

At operation 320, the processing device determines if the average temperature satisfies a dynamic temperature threshold. As described in example above, the media temperature manager 113 compares the average temperature to a stored dynamic temperature threshold value. The stored dynamic temperature threshold can be one of the four dynamic thresholds described above. In some embodiments, the media temperature manager 113 compares the average temperature to more than one dynamic temperature threshold and selects the one or more thresholds based upon a current mode of operation of the memory subsystem 110. For example, the media temperature manager 113 can use the first temperature threshold when the memory subsystem 110 is operating normally/without throttling, the second and/or fourth temperature threshold when the memory subsystem 110 is throttling or otherwise restricting the throughput of memory operations, and the second and/or third temperature threshold when the memory subsystem 110 halts all memory operations.

If the average temperature satisfies the dynamic temperature threshold, the method 300 proceeds to operation 325. In one embodiment, the average temperature satisfies the dynamic temperature threshold when the average temperature is less than (or less than or equal to) the dynamic temperature threshold value. If the average temperature does not satisfy the dynamic temperature threshold, the method 300 proceeds to operation 335. In one embodiment, the average temperature fails to satisfy the dynamic temperature threshold when the average temperature is greater than (or greater than or equal to) the dynamic temperature threshold value.

At operation 325, the processing device determines if the dynamic temperature threshold is currently at a minimum value. For example, the media temperature manager 113 can utilize a range of permitted values for adjusting the dynamic temperature threshold. If the dynamic temperature threshold is currently at the minimum value, the method 300 returns to operation 305. If the dynamic temperature threshold is not currently at the minimum value, the method 300 proceeds to operation 330.

At operation 330, the processing device decreases the value of one or more dynamic temperature thresholds. For example, if the dynamic temperature threshold is currently assigned a value of 60 degrees Celsius and the average temperature is 65 degrees Celsius and the minimum value for the dynamic temperature threshold is 50 degrees Celsius, the media temperature manager 113 updates the dynamic temperature threshold to new value of 60 degrees Celsius. Other embodiments can decrease the dynamic temperature threshold by a greater or a lesser amount. With the dynamic temperature threshold updated, the method 300 returns to operation 305.

At operation 335, the processing device determines if the dynamic temperature threshold is currently at a maximum value (e.g., of the range of permitted values). If the dynamic temperature threshold is currently at the maximum value, the method 300 returns to operation 305. If the dynamic temperature threshold is not currently at the maximum value, the method 300 proceeds to operation 340.

At operation 340, the processing device increases the value of one or more dynamic temperature thresholds. For example, if the dynamic temperature threshold is currently assigned a value of 60 degrees Celsius and the average temperature is 30 degrees Celsius and the maximum value for the dynamic temperature threshold is 75 degrees Celsius, the media temperature manager 113 updates the dynamic temperature threshold to new value of 65 degrees Celsius. Other embodiments can decrease the dynamic temperature threshold by a greater or a lesser amount. With the dynamic temperature threshold updated, the method 300 returns to operation 305.

While the methods 200 and 300 are described with reference to the memory subsystem 110 generally, temperature measurements and triggers can be tracked for, and therefore dynamic temperature thresholds adjusted for, a subdivision of the memory subsystem 110 or multiple memory subsystems 110 operated as a group. For example, the media temperature manager 113 can track temperature measurements and triggering events per package, die, plane, block, etc. (collectively referred to as a "media unit") and manage dynamic temperature thresholds for each corresponding media unit.

Figure 4:
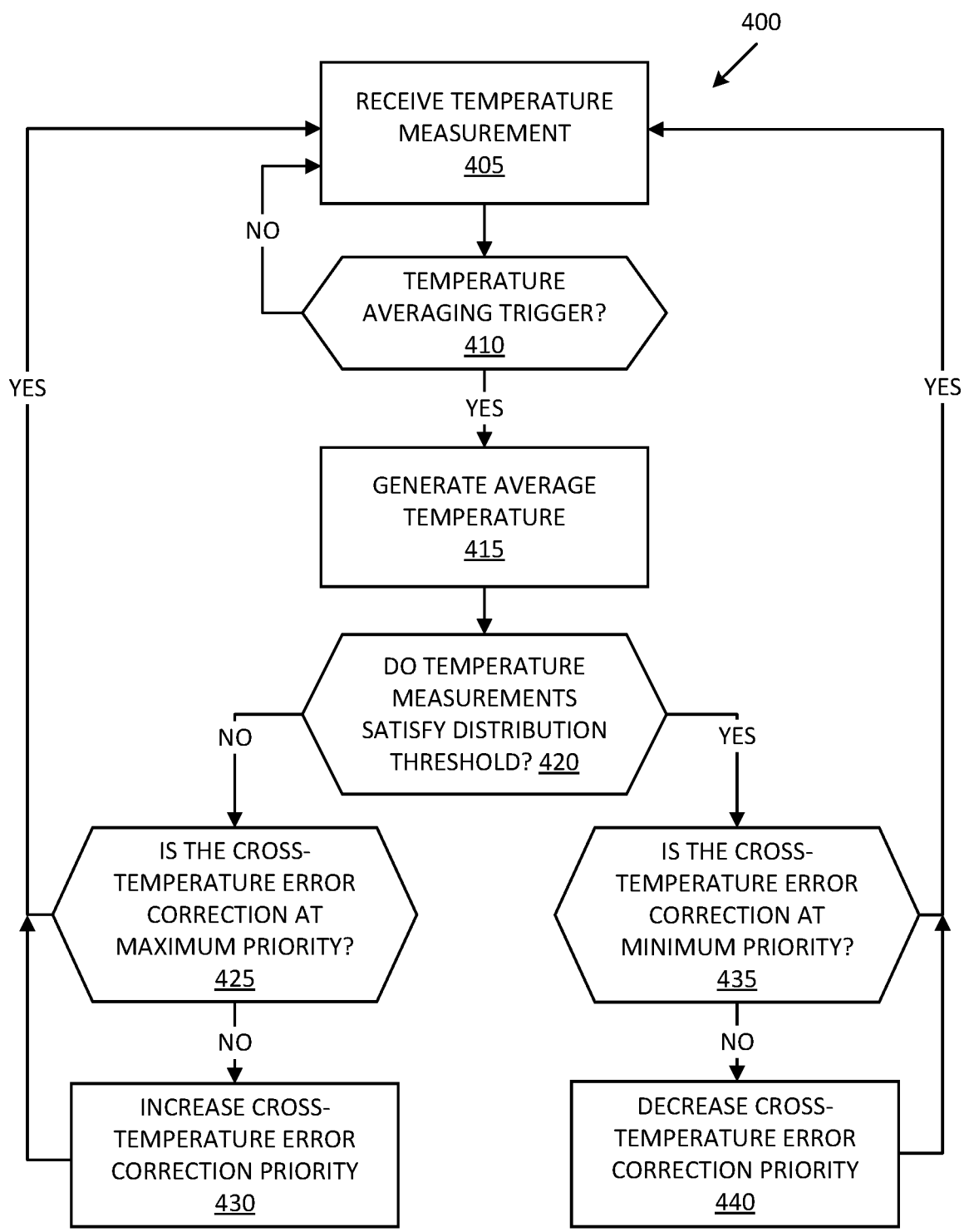
FIG. 4 is a flow diagram of an example method to manage error correction schemes based upon memory subsystem operating temperature measurements in accordance with some embodiments of the present disclosure.

FIG. 4 is a flow diagram of an example method 400 to manage error correction schemes based upon memory subsystem operating temperature measurements in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the media temperature manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device the processing device receives operating temperature measurements for the memory devices 130. As described above, the memory subsystem 110 can include a thermal sensor and the media temperature manager 113 periodically receives and stores an operating temperature measurement from the thermal sensor.

At operation 410, the processing device determines if a trigger event for generating an average temperature has occurred. As described above, the media temperature manager 113 can use an amount of time passing, a number of program-erase (PE) cycles (or average number of PE cycles), or another event to trigger the generation of an average temperature.

At operation 415, the processing device generates an average temperature using multiple operating temperature measurements. As described in the examples above, the media temperature manager 113 can read a set of stored operating temperature measurements from the local memory 119 and generate a running average.

At operation 420, the processing device determines if the temperature measurements satisfy a distribution threshold. For example, the media temperature manager 113 evaluates the amount of variation or dispersion of values in the set of temperature measurements. A tight clustering of temperature measurement values around the average temperature (or mean temperature) is an indication of less risk of cross-temperature errors. A set of temperature measurements with many outlier temperature measurements is an indication of more risk of cross-temperature errors.

In one embodiment, the media temperature manager 113 utilizes a count of outlier temperature values to evaluate the amount of variation or dispersion. An outlier temperature value differs from the average temperate by at least a difference threshold value. If the count of outlier temperature measurements is greater than (or greater than or equal to) the distribution threshold, the temperature measurement outliers fail to satisfy the distribution threshold.

In one embodiment, the media temperature manager 113 utilizes the standard deviation, interquartile range (IQR), or another quantity to represent the distribution of temperature measurement values (rather than a count of individual outliers). In such an embodiment, the media temperature manager 113 compares that quantity to the distribution threshold. For example, if this quantity representing the distribution of temperature measurement values is less than (or less than or equal to) the distribution threshold, the temperature measurement outliers satisfy the distribution threshold.

If the temperature measurements fail to satisfy the distribution threshold, the method 400 proceeds to operation 425. If the temperature measurements satisfy the distribution threshold, the method 400 proceeds to operation 435.

At operation 425, the processing device determines if the cross-temperature error correction scheme is at a maximum priority value. For example, the memory subsystem 110 can utilize multiple error correction schemes when reading data from a memory component 112 and apply the error correction schemes in order of priority. Error correction schemes include evaluating parity bits or checksums, a cyclic redundancy check (CRC), various error-correcting codes (ECC), etc. The memory subsystem 110 can prioritize the application of such error correction schemes based upon an amount of time or processing resources needed to apply the scheme, the likelihood the scheme will correct errors, etc. If an error correction scheme fails to correct the errors in the data, the memory subsystem 110 applies the next error correction scheme in order of priority. The cross-temperature error correction scheme addresses errors resulting from cross-temperature differences between writing and reading data. In one embodiment, a cross-temperature error correction scheme employs a set of offsets to compensate for temperature. For example, the processor can reduce a read voltage by 100 millivolts to compensate for a change in temperature from when the data was written. Additionally, or alternatively, the processor can move such read operations to a higher point in an error correction flow (e.g., applying a stronger error correction algorithm).

In one embodiment, the maximum priority value for the cross-temperature error correction scheme is the maximum priority value for all error correction schemes. In another embodiment, the maximum priority value for the cross-temperature error correction scheme is less than the maximum priority value for all error correction schemes (i.e., the memory subsystem 110 will apply one or more error correction schemes prior to the cross-temperature error correction scheme even when at the maximum priority value).

If the cross-temperature error correction scheme is currently at the maximum priority value, the method 400 returns to operation 405. If the cross-temperature error correction scheme is not at the maximum priority value, the method 400 proceeds to operation 430.

At operation 430, the processing device increases the priority value of the cross-temperature error correction scheme. As noted above, a set of temperature measurements with many outlier temperature measurements is an indication of increased risk of cross-temperature errors. As such, prioritization of the cross-temperature error correction scheme can enable the memory subsystem 110 to quickly resolve errors. With the priority value of the cross-temperature error correction scheme updated, the method 400 returns to operation 405.

At operation 435, the processing device determines if the cross-temperature error correction scheme is at a minimum priority value. Similar to the maximum priority value, the minimum priority value can be a minimum for all error correction schemes or a subset of the error correction schemes. If the cross-temperature error correction scheme is currently at the minimum priority value, the method 400 returns to operation 405. If the cross-temperature error correction scheme is not at the minimum priority value, the method 400 proceeds to operation 440.

At operation 440, the processing device decreases the priority value of the cross-temperature error correction scheme. As noted above, set of temperature measurements with a tight distribution of temperature measurements is an indication of reduced risk of cross-temperature errors. As such, a lower prioritization of the cross-temperature error correction scheme can enable the memory subsystem 110 to quickly resolve errors by applying schemes that are more likely to address the cause of the errors. With the priority value of the cross-temperature error correction scheme updated, the method 400 returns to operation 405.

Figure 5:
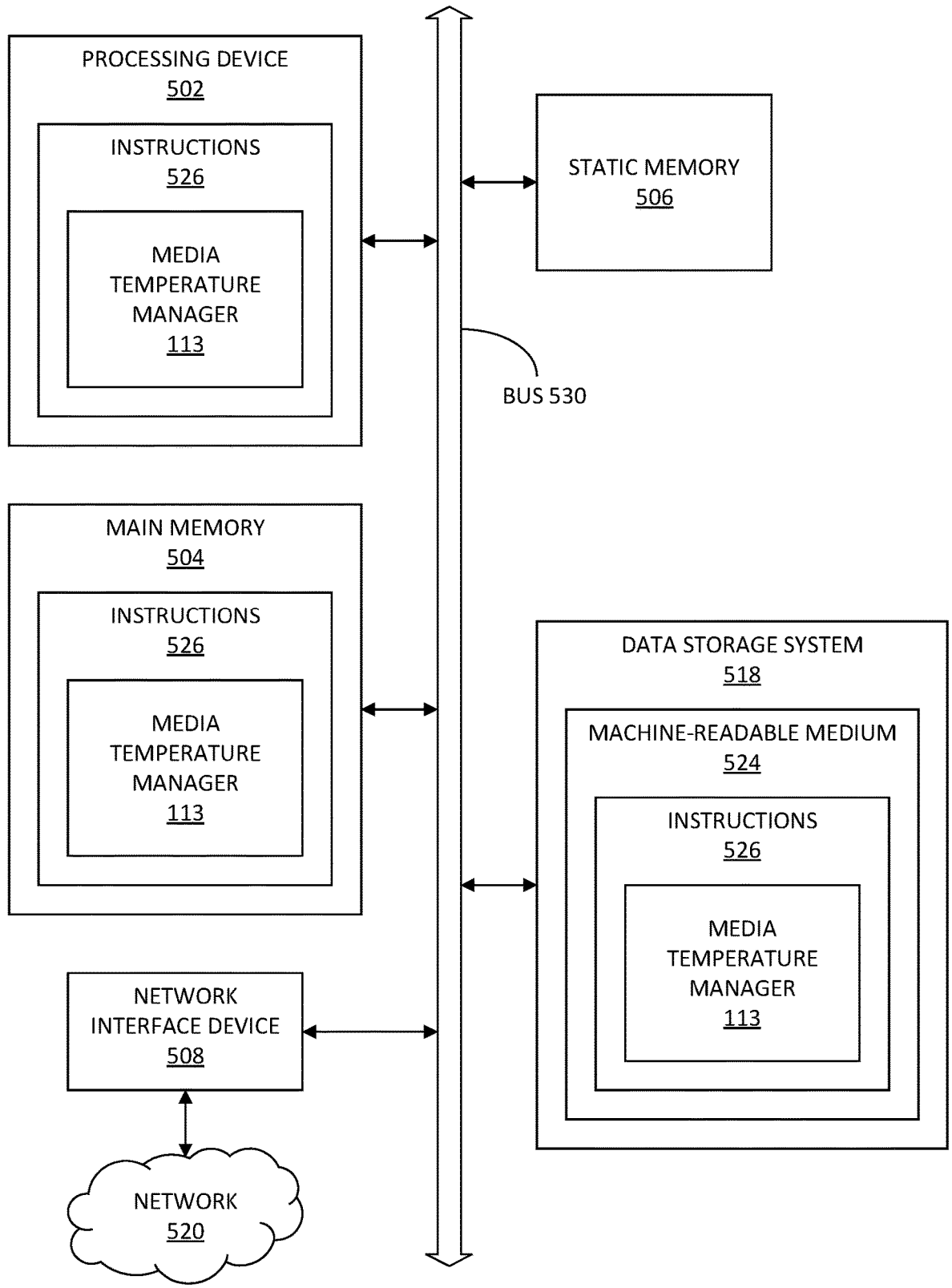
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the media temperature manager 113 of FIG. 1). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a non-transitory computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to a media temperature manager (e.g., the media temperature manager 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200, 300, and 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving operating temperature measurements for a memory subsystem, the memory subsystem using a plurality of error correction schemes;
generating a first average temperature using the operating temperature measurements;
applying each error correction scheme of the plurality of error correction schemes in order of priority until successfully correcting errors;
determining that a distribution of the operating temperature measurements does not satisfy a distribution threshold; and
in response to determining that a distribution of the operating temperature measurements do not satisfy a distribution threshold, increasing a priority value of a cross-temperature error correction scheme, wherein increasing the priority value for the cross-temperature error correction scheme results in the memory subsystem utilizing the cross-temperature error correction scheme prior to another error correction scheme that was previously utilized prior to the cross-temperature error correction scheme.

2. The method of claim 1, wherein the operating temperature measurements represent a history of operating temperatures for the memory subsystem and the first average temperature is generated in response to a completion of a number of program-erase cycles.

3. A non-transitory computer-readable storage medium comprising instructions that, when executed by a processing device, cause the processing device to:
receive operating temperature measurements for a memory subsystem, the memory subsystem using a plurality of error correction schemes;
generate a first average temperature using the operating temperature measurements;
apply each error correction scheme of the plurality of error correction schemes in order of priority until successfully correcting errors;

determine that a distribution of the operating temperature measurements does not satisfy a distribution threshold; and in response to determining that a distribution of the operating temperature measurements do not satisfy a distribution threshold, increase a priority value of a cross-temperature error correction scheme wherein increasing the priority value for the cross-temperature error correction scheme results in the memory subsystem utilizing the cross-temperature error correction scheme prior to another error correction scheme that was previously utilized prior to the cross-temperature error correction scheme.

4. The non-transitory computer-readable storage medium of claim 3, wherein the operating temperature measurements represent a history of operating temperatures for the memory subsystem and the first average temperature is generated in response to a completion of a number of program-erase cycles.

5. A system comprising:
a memory component; and
a processing device, operatively coupled with the memory component, to:
receive operating temperature measurements for the memory component, the memory component using a plurality of error correction schemes;
generate a first average temperature using the operating temperature measurements in response to a completion of a number of program-erase cycles;
apply each error correction scheme of the plurality of error correction schemes in order of priority until successfully correcting errors;
compare a distribution of the operating temperature measurements to a distribution threshold; and
in response to comparing the distribution of the operating temperature measurements to the distribution threshold, adjust a priority of a cross-temperature error correction scheme, wherein adjusting the priority for the cross-temperature error correction scheme results in the memory component utilizing the cross-temperature error correction scheme prior to another error correction scheme that was previously utilized prior to the cross-temperature error correction scheme.

6. The system of claim 5, wherein the operating temperature measurements represent a history of operating temperatures for the system.

7. The method of claim 1, further comprising:
in response to determining that a subsequent distribution of the operating temperature measurements does not satisfy the distribution threshold, determining that the cross-temperature error correction scheme is at a maximum priority; and
in response to determining that the cross-temperature error correction scheme is at the maximum priority, forgoing an additional increase in priority of the cross-temperature error correction scheme.

8. The method of claim 1, further comprising determining that a trigger event for generating an average temperature has been satisfied prior to generating the first average temperature.

9. The method of claim 1, further comprising:
determining that a trigger event for generating an average temperature has not been satisfied; and
receiving additional operating temperature measurements for a memory subsystem.

10. The method of claim 1, further comprising:
receiving additional operating temperature measurements for the memory subsystem;
determining that an additional distribution of the additional operating temperature measurements satisfy a distribution threshold; and
in response to determining that a distribution of the operating temperature measurements satisfy the distribution threshold, decreasing a priority value of a cross-temperature error correction scheme.

11. The non-transitory computer-readable storage medium of claim 3, wherein the processing device is further to:
in response to determining that a subsequent distribution of the operating temperature measurements does not satisfy the distribution threshold, determine that the cross-temperature error correction scheme is at a maximum priority; and
in response to determining that the cross-temperature error correction scheme is at the maximum priority, forgo an additional increase in priority of the cross-temperature error correction scheme.

12. The non-transitory computer-readable storage medium of claim 3, wherein the processing device is further to determine that a trigger event for generating an average temperature has been satisfied prior to generating the first average temperature.

13. The non-transitory computer-readable storage medium of claim 3, wherein the processing device is further to:
determine that a trigger event for generating an average temperature has not been satisfied; and
receive additional operating temperature measurements for a memory subsystem.

14. The system of claim 5, wherein the processing device is further to:
in response to determining that a subsequent distribution of the operating temperature measurements does not satisfy the distribution threshold, determine that the cross-temperature error correction scheme is at a maximum priority; and
in response to determining that the cross-temperature error correction scheme is at the maximum priority, forgo an additional increase in priority of the cross-temperature error correction scheme.

15. The system of claim 5, wherein the processing device is further to determine that a trigger event for generating an average temperature has been satisfied prior to generating the first average temperature.

16. The system of claim 5, wherein the processing device is further to:
determine that a trigger event for generating an average temperature has not been satisfied; and
receiving additional operating temperature measurements for a memory subsystem.

* * * * *